(12) United States Patent
Jung

(10) Patent No.: US 11,626,473 B2
(45) Date of Patent: Apr. 11, 2023

(54) ORGANIC LIGHT-EMITTING DIODE DISPLAY DEVICE HAVING A SECOND ELECTRODE WITH IMPROVED ELECTRICAL CONTACT WITH A CONNECTION ELECTRODE IN A CONTACT AREA

(71) Applicant: LG Display Co., Ltd., Seoul (KR)

(72) Inventor: Sunggoo Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 135 days.

(21) Appl. No.: 17/131,220

(22) Filed: Dec. 22, 2020

(65) Prior Publication Data
US 2021/0202682 A1 Jul. 1, 2021

(30) Foreign Application Priority Data
Dec. 31, 2019 (KR) .......................... 10-2019-0180150

(51) Int. Cl.
*H01L 29/08* (2006.01)
*H01L 27/32* (2006.01)
*H01L 51/52* (2006.01)

(52) U.S. Cl.
CPC ...... *H01L 27/3279* (2013.01); *H01L 27/3258* (2013.01); *H01L 51/5228* (2013.01)

(58) Field of Classification Search
CPC ............. H01L 27/3258; H01L 27/3279; H01L 51/5228
USPC ............................................................ 257/40
See application file for complete search history.

(56) References Cited

U.S. PATENT DOCUMENTS

2008/0238311 A1* 10/2008 Sung .................... H01L 51/5246
445/25
2020/0083311 A1* 3/2020 Cha ...................... H01L 27/3276

* cited by examiner

*Primary Examiner* — Phuc T Dang
(74) *Attorney, Agent, or Firm* — Birch, Stewart, Kolasch & Birch, LLP

(57) ABSTRACT

An organic light-emitting diode display device includes a substrate in which an emission area and a non-emission area are defined, a power line provided on the substrate, at least one insulation film covering the power line, a light-emitting element provided above the at least one insulation film, a connection electrode connected to the power line, and extending onto the at least one insulation film, and a passivation film including a contact area where a portion of the connection electrode is exposed in the non-emission area, wherein the light-emitting element includes a first electrode, an emission layer, and a second electrode that are stacked in order, and the second electrode is in direct contact with the connection electrode in the contact area.

20 Claims, 14 Drawing Sheets

ORGANIC LIGHT-EMITTING DIODE DISPLAY DEVICE HAVING A SECOND ELECTRODE WITH IMPROVED ELECTRICAL CONTACT WITH A CONNECTION ELECTRODE IN A CONTACT AREA

CROSS REFERENCE TO RELATED APPLICATION

The present application claims priority to the Korean Patent Application No. 10-2019-0180150, filed on Dec. 31, 2019 in the Republic of Korea, the entire contents of which are hereby expressly incorporated by reference into the present application.

BACKGROUND OF THE INVENTION

Field of the Invention

The present disclosure relates to an organic light-emitting diode display device.

Description of the Related Art

As information society has developed, various types of display devices have been developed. In recent years, various display devices, such as a liquid crystal display (LCD), a plasma display panel (PDP), and an organic light-emitting diode (OLED) display device, have been used.

Organic light-emitting elements constituting an organic light-emitting diode display device are self-luminous and do not require a separate light source, so that the thickness and the weight of the display device are reduced. In addition, the organic light-emitting diode display device has high quality characteristics, such as low power consumption, high luminance, and a high response rate.

The organic light-emitting diode display device includes pixels that include transistors, capacitors, and light-emitting elements. As the display device increases in resolution and size, a number of pixels are densely arranged in the display device. In order to secure the reliability of the display device, a method capable of reducing the complexity of the process and enhancing the yield is needed.

In particular, the organic light-emitting diode display device includes multiple contact holes and each of the contact holes electrically connects one wire to another. In order to reduce power consumption and heat of the display device, the structure of a contact hole with reduced resistance is needed.

The foregoing is intended merely to aid in the understanding of the background of the present disclosure, and is not intended to mean that the present disclosure falls within the purview of the related art that is already known to those skilled in the art.

SUMMARY OF THE INVENTION

The present disclosure is directed to providing an organic light-emitting diode display device that includes a contact-hole structure with reduced resistance.

It is to be understood that technical problems to be solved by the present disclosure are not limited to the aforementioned technical problems and other technical problems which are not mentioned will be apparent from the following description to those skilled in the art.

According to several embodiments of the present disclosure, there is provided an organic light-emitting diode display device including: a substrate in which an emission area and a non-emission area are defined; a power line provided on the substrate; at least one insulation film covering the power line; a light-emitting element provided above the at least one insulation film; a connection electrode connected to the power line, and extending onto the at least one insulation film; and a passivation film including a contact area where a portion of the connection electrode is exposed in the non-emission area, wherein the light-emitting element includes a first electrode, an emission layer, and a second electrode that are stacked in order, and the second electrode is in direct contact with the connection electrode in the contact area.

In several embodiments of the present disclosure, the contact area can include one sidewall defined by the passivation film, and the one sidewall can have a reverse-tapered shape.

In several embodiments of the present disclosure, an upper surface of the connection electrode can include a shadow area that is vertically overlapped by the one sidewall, and the second electrode can be in direct contact with the shadow area.

In several embodiments of the present disclosure, the emission layer may not be provided on the shadow area.

In several embodiments of the present disclosure, the contact area can include a filler provided at a central portion of an upper surface of the connection electrode exposed by the passivation film, and a rounded lower surface portion of the filler can form a shadow area on the connection electrode.

In several embodiments of the present disclosure, the second electrode can be in direct contact with the shadow area.

In several embodiments of the present disclosure, the second electrode can be in contact with the lower surface portion of the filler.

According to other embodiments of the present disclosure, there is provided an organic light-emitting diode display device including: a substrate in which an emission area and a non-emission area are defined; a power line provided on the substrate; at least one insulation film covering the power line; a light-emitting element provided above the at least one insulation film; a connection electrode connected to the power line, and extending onto the at least one insulation film; a passivation film including a contact area where a portion of the connection electrode is exposed in the non-emission area; and a conductive filler covering at least a portion of an upper surface of the connection electrode exposed by the passivation film, wherein the light-emitting element includes a first electrode, an emission layer, and a second electrode that are stacked in order, and the second electrode is in direct contact with the conductive filler.

In several embodiments of the present disclosure, a conductive path between the second electrode and the connection electrode can be provided through the conductive filler.

In several embodiments of the present disclosure, the conductive filler can cover at least a portion of opposite sidewalls of the contact area.

In several embodiments of the present disclosure, a rounded lower surface portion of the conductive filler can form a shadow area on the connection electrode.

In several embodiments of the present disclosure, the second electrode can be in contact with the lower surface portion of the conductive filler.

According to other embodiments of the present disclosure, there is provided an organic light-emitting diode display device including: a substrate in which an emission area and a non-emission area are defined; a power line provided on the substrate; at least one insulation film covering the power line; a light-emitting element provided above the at least one insulation film; a connection electrode connected to the power line, and extending onto the at least one insulation film; a passivation film including a contact area where a portion of the connection electrode is exposed in the non-emission area; and at least one filler covering an upper surface of the connection electrode exposed by the passivation film, wherein the light-emitting element includes a first electrode, an emission layer, and a second electrode that are stacked in order, and the emission layer extends to cover the connection electrode and the filler, and has a first portion on the connection electrode and a second portion on the filler that are different in thickness.

In several embodiments of the present disclosure, the thickness of the first portion can be smaller than the thickness of the second portion.

In several embodiments of the present disclosure, penetrating through the at least one insulation film, the contact area can expose the power line.

According to the embodiments of the present disclosure, in the organic light-emitting diode display device, the connection electrode and the second electrode of the light-emitting element are in direct contact with each other by using the shape of the sidewall, the filler, or the like. Accordingly, the contact resistance of the structure of the contact area can be reduced, and the power consumption and the heat of the organic light-emitting diode display device can be reduced.

Effects advantages that can be obtained from the present disclosure will not be limited to only the above and below described effects and advantages. In addition, other effects and advantages which are not described herein will become apparent to those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE EMBODIMENTS

Figure 1:
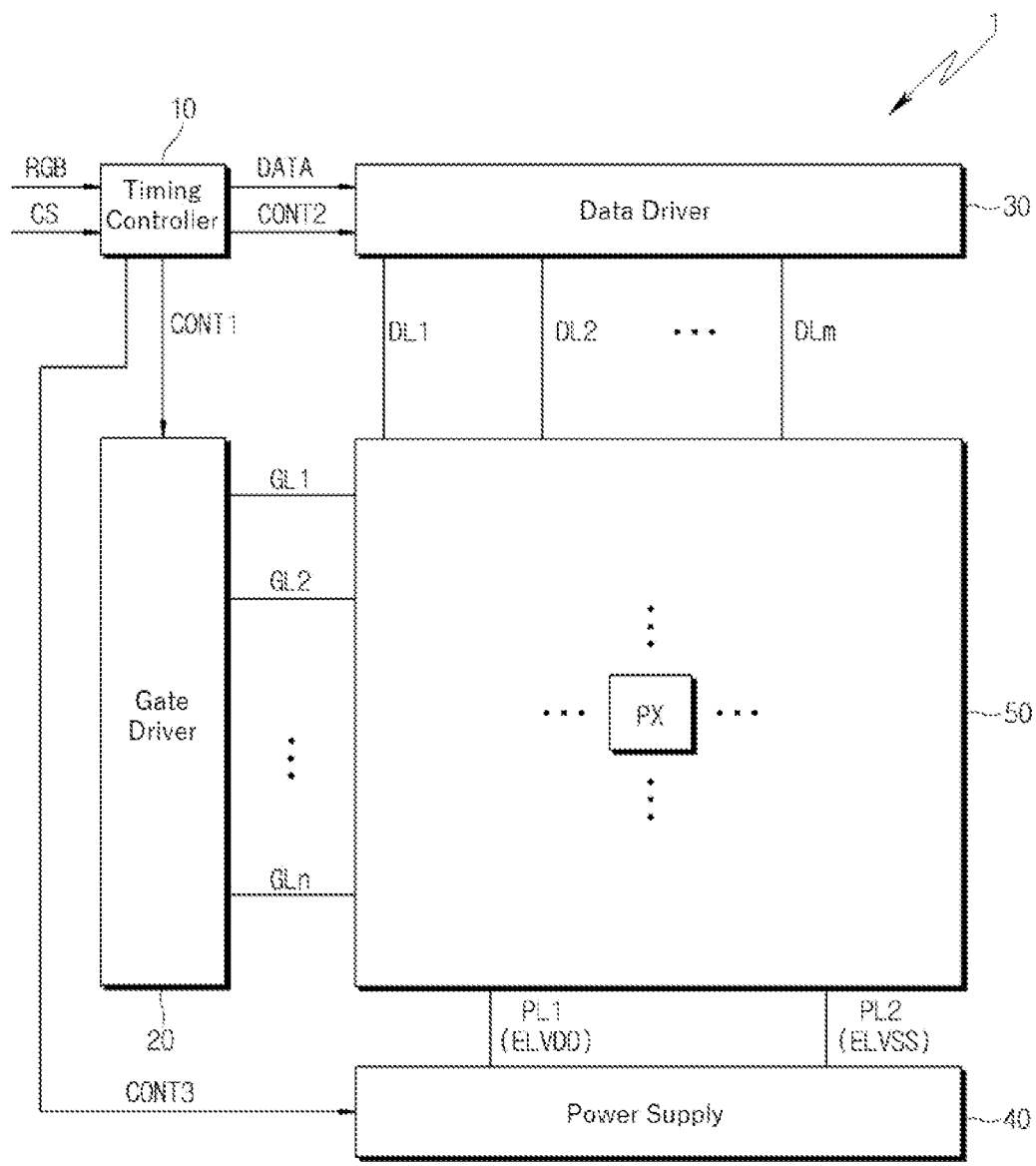
FIG. 1 is a block diagram showing a configuration of a display device according to several embodiments of the present disclosure.

Hereinafter, various embodiments will be described with reference to the accompanying drawings. In the specification, when an element (area, layer, part, or the like) is referred to as being "on", "coupled to", or "combined with" another element, it can be directly on/coupled to/combined with the other element or an intervening element can be present therebetween.

The same reference numerals refer to same elements. In the drawings, the thicknesses, ratios, and sizes of the elements are exaggerated for effective description of the technical details. The term "and/or" includes one or more combinations that the associated elements can define.

Terms "first", "second", etc. can be used to describe various elements, but the elements are not to be construed as being limited to the terms. The terms are only used to differentiate one element from other elements and may not define any order. For example, the "first" element can be named the "second" element without departing from the scope of the various embodiments, and the "second" element can also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof can exist or can be added.

FIG. 1 is a block diagram showing a configuration of a display device according to an embodiment of the present disclosure. All the components of the display device according to all embodiments of the present disclosure are operatively coupled and configured.

Referring to FIG. 1, a display device 1 includes a timing controller 10, a gate driver 20, a data driver 30, a power supply 40, and a display panel 50.

The timing controller 10 can receive an image signal RGB and a control signal CS from outside. The image signal RGB can include grayscale data. The control signal CS can include, for example, a horizontal synchronization signal, a vertical synchronization signal, and a main clock signal.

The timing controller 10 can process the image signal RGB and the control signal CS to make the signals appropriate for an operation condition of the display panel 50, so that the timing controller 10 can generate and output image data DATA, a gate driving control signal CONT1, a data driving control signal CONT2, and a power supply control signal CONT3.

The gate driver 20 can be connected to pixels PXs of the display panel 50 through multiple gate lines GL1 to GLn. The gate driver 20 can generate gate signals on the basis of the gate driving control signal CONT1 output from the timing controller 10. The gate driver 20 can provide the generated gate signals to the pixels PXs through the multiple gate lines GL1 to GLn, where n can be a positive number such as an integer equal to or greater than 2.

The data driver 30 can be connected to the pixels PXs of the display panel 50 through multiple data lines DL1 to DLm, where m can be a positive number such as an integer equal to or greater than 2. The data driver 30 can generate data signals on the basis of the image data DATA and the data driving control signal CONT2 output from the timing controller 10. The data driver 30 can provide the generated data signals to the pixels PXs through the multiple data lines DL1 to DLm.

The power supply 40 can be connected to the pixels PXs of the display panel 50 through multiple power lines PL1 and PL2. The power supply 40 can generate a driving voltage to be provided to the display panel 50, on the basis of the power supply control signal CONT3. The driving voltage can include, for example, a high-potential driving voltage ELVDD and a low-potential driving voltage ELVSS. The power supply 40 can provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs can be, for example, arranged in a matrix form on the display panel 50.

Each of the pixels PXs can be electrically connected to the corresponding gate line and the corresponding data line. Such pixels PXs can emit light with luminance corresponding to the gate signals and the data signals that are supplied through the gate lines GL1 to GLn and the data lines DL1 to DLm, respectively.

Each pixel PX can display any one among a first to a third color. In an embodiment, each pixel PX can display any one among red, green, and blue colors. In another embodiment, each pixel PX can display any one among cyan, magenta, and yellow colors. In various embodiments, the pixels PXs can be constructed to display any one among four or more colors. For example, each pixel PX can display any one among red, green, blue, and white colors.

The timing controller 10, the gate driver 20, the data driver 30, and the power supply 40 can be constructed as separate integrated circuits (ICs), or ICs in which at least some thereof are integrated. For example, at least one among the data driver 30 and the power supply 40 can be configured as an integrated circuit integrated with the timing controller 10.

In addition, in FIG. 1, the gate driver 20 and the data driver 30 are shown as elements separate from the display panel 50, but at least one among the gate driver 20 and the data driver 30 can be constructed in an in-panel manner that is formed being integrated with the display panel 50. For example, the gate driver 20 can be formed being integrated with the display panel 50 according to a gate-in-panel (GIP) manner.

Figure 2:
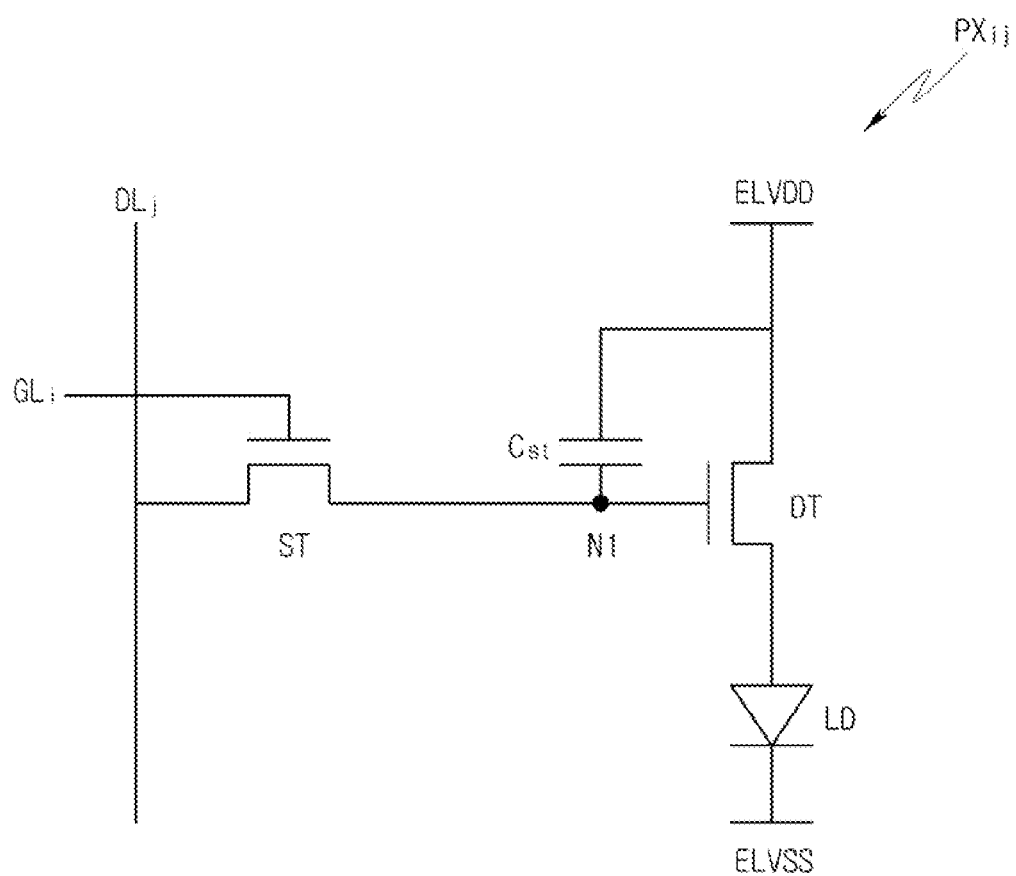
FIG. 2 is a circuit diagram showing several embodiments of the pixel shown in FIG. 1.

FIG. 2 is a circuit diagram showing several embodiments of the pixel shown in FIG. 1. FIG. 2 shows, as an example, a pixel PXij that is connected to an i-th gate line GLi and a j-th data line DLj.

Referring to FIG. 2, the pixel PX includes a switching transistor ST, a driving transistor DT, a storage capacitor Cst, and a light-emitting element LD.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th gate line GLi. The switching transistor ST is turned on when a gate signal at a gate-on level is applied through the i-th gate line GLi, and transmits a data signal applied through the j-th data line DLj, to the first node N1.

A first electrode of the storage capacitor Cst is electrically connected to the first node N1, and a second electrode of the storage capacitor Cst is connected to an anode electrode of the light-emitting element LD. According to the data voltage stored in the storage capacitor Cst, the driving transistor DT operates so that a driving current flows between the high-potential driving voltage ELVDD and the low-potential driving voltage ELVSS.

A first electrode (for example, a source electrode) of the driving transistor DT receives the high-potential driving voltage ELVDD, and a second electrode (for example, a drain electrode) of the driving transistor DT is electrically connected to a first electrode (for example, the anode electrode) of the light-emitting element LD. A gate electrode of the driving transistor DT is electrically connected to the first node N1. The driving transistor DT is turned on when a voltage at a gate-on level is applied through the first node N1, and can control the amount of a driving current flowing to the light-emitting element LD depending on a voltage applied to the gate electrode.

The light-emitting element LD outputs light corresponding to the driving current. The light-emitting element LD can output light corresponding to any one among red, green, and blue colors. The light-emitting element LD can be an organic light-emitting diode (OLED) or an ultra-small inorganic light-emitting diode having a size in a micro to nanoscale range, but the present disclosure is not limited thereto. Hereinafter, an embodiment in which the light-emitting element LD is an organic light-emitting diode (OLED) will be described.

In various embodiments of the present disclosure, the structure of the pixels PX is not limited to that shown in FIG. 2. According to an embodiment, the pixels PXs can further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST and the driving transistor DT are NMOS transistors, but the present disclosure is not limited thereto. For example, at least some or all of the transistors constituting each pixel PX can be PMOS transistors. In various embodiments, each of the switching transistor ST and the driving transistor DT can be implemented as a low-temperature polycrystalline silicon (LTPS) thin-film transistor, an oxide thin-film transistor, or a low-temperature polycrystalline oxide (LTPO) thin-film transistor.

Figure 3:
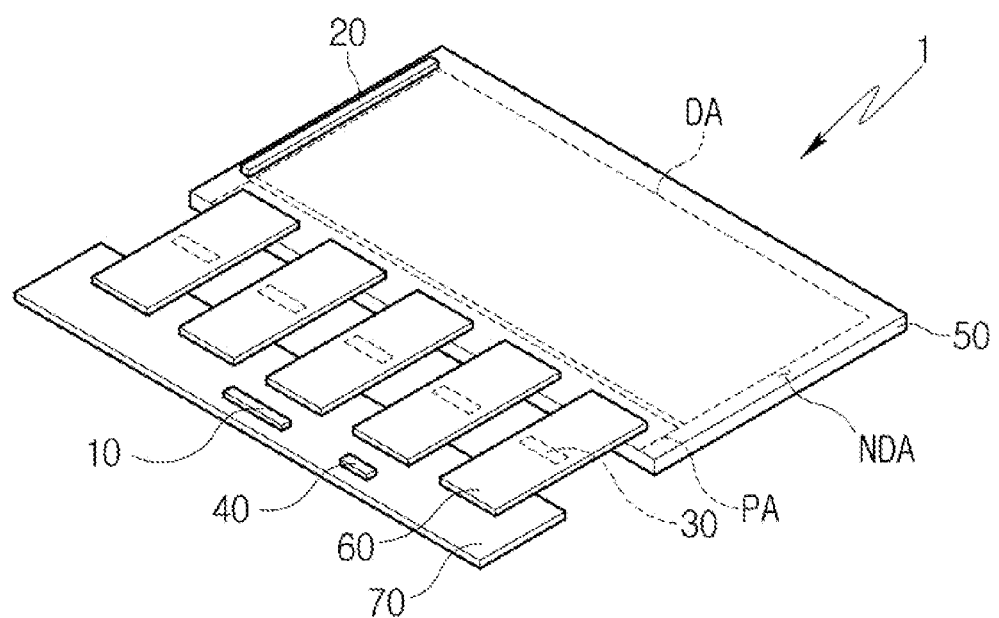
FIG. 3 is a perspective view according to several embodiments of the display device shown in FIG. 1.

FIG. 3 is a perspective view according to several embodiments of the display device shown in FIG. 1. With reference to FIG. 3 in connection with FIGS. 1 and 2, the elements of the display device 1 will be described in more detail.

Referring to FIG. 3, the display device 1 is a device for displaying images. The display device 1 can be a self-luminous display device, such as an organic light-emitting diode display device; or a non-self-luminous display device, such as a liquid crystal display device, an electrophoretic display (EPD), and an electrowetting display (EWD).

The display device 1 can be implemented in various shapes. For example, the display device 1 can be implemented in the shape of a rectangular plate. However, the present disclosure is not limited thereto. The display device 1 can be provided in various shapes, such as square, circular, elliptical, polygonal shapes, and the like. The display device 1 can have a shape in which part of an edge is processed to be a curved surface or the thicknesses in at least one area vary. In addition, all or part of the display device 1 can have flexibility.

The display panel 50 can include a display area DA and a non-display area NDA. The display area DA is an area in which the pixels PXs are arranged, and can be referred to as an active area. The non-display area NDA can be placed near the display area DA. For example, the non-display area NDA can be placed along the border of the display area DA. The non-display area NDA can comprehensively refer to an area except the display area DA on the display panel 50, and can be referred to as a non-active area.

In the non-display area NDA, as a driver for driving the pixels PXs, for example, the gate driver 20 can be provided. In the non-display area NDA, the gate driver 20 can be placed near one side or both sides of the display area DA. The gate driver 20 can be formed in the non-display area NDA of the display panel 50 in a gate-in-panel manner as shown in FIG. 3. However, in another embodiment, the gate driver 20 can be manufactured as a driver IC and can thus be mounted on a flexible film, or the like, and can be attached to the non-display area NDA in a tape-automated bonding (TAB) manner.

In the non-display area NDA, multiple pads can be provided. The pads may not be covered by an insulation layer, but can be exposed to the outside of the display panel 50 and can be electrically connected to the data driver 30, a circuit board 70, and the like that will be described later.

The display panel 50 can include wires for supplying electrical signals to the pixels PXs. The wires can include, for example, the gate lines GL1 to GLn, the data lines DL1 to DLm, and the power lines PL1 and PL2.

The power lines PL1 and PL2 can be electrically connected to the power supply 40 (or the timing controller 10) through the connected pads, and can provide the high-potential driving power ELVDD and the low-potential driving power ELVSS provided from the power supply 40 (or the timing controller 10), to the pixels PXs.

A flexible film 60 is provided with a first end attached to a pad area PA of the display panel 50, and is provided with a second end attached to the circuit board 70, so that the display panel 50 and the circuit board 70 can be electrically connected. The flexible film 60 can include multiple wires for electrically connecting the pads formed in the pad area PA and wires of the circuit board 70. In an embodiment, the flexible film 60 can be attached on the pads through an anisotropic conducting film (ACF).

In the case where the data driver 30 is manufactured as a driver IC, the data driver 30 can be mounted on the flexible film 60 in a chip-on-film (COF) manner or a chip-on-plastic (COP) manner. The data driver 30 can generate data signals on the basis of the image data DATA and the data driving control signal CONT2 received from the timing controller 10, and can output the generated data signals to the data lines DL1 to DLm through the connected pads.

On the circuit board 70, a number of circuits implemented as driver ICs can be mounted. The circuit board 70 can be a printed circuit board or a flexible printed circuit board, but the type of the circuit board 70 is not limited thereto.

The circuit board 70 can include the timing controller 10 and the power supply 40 mounted in the form of an integrated circuit. FIG. 3 shows that the timing controller 10 and the power supply 40 are separate elements, but this embodiment is not limited thereto. That is, in various embodiments, the power supply 40 can be formed being integrated with the timing controller 10, or the timing controller 10 can be configured to perform the function of the power supply 40.

Figure 4:
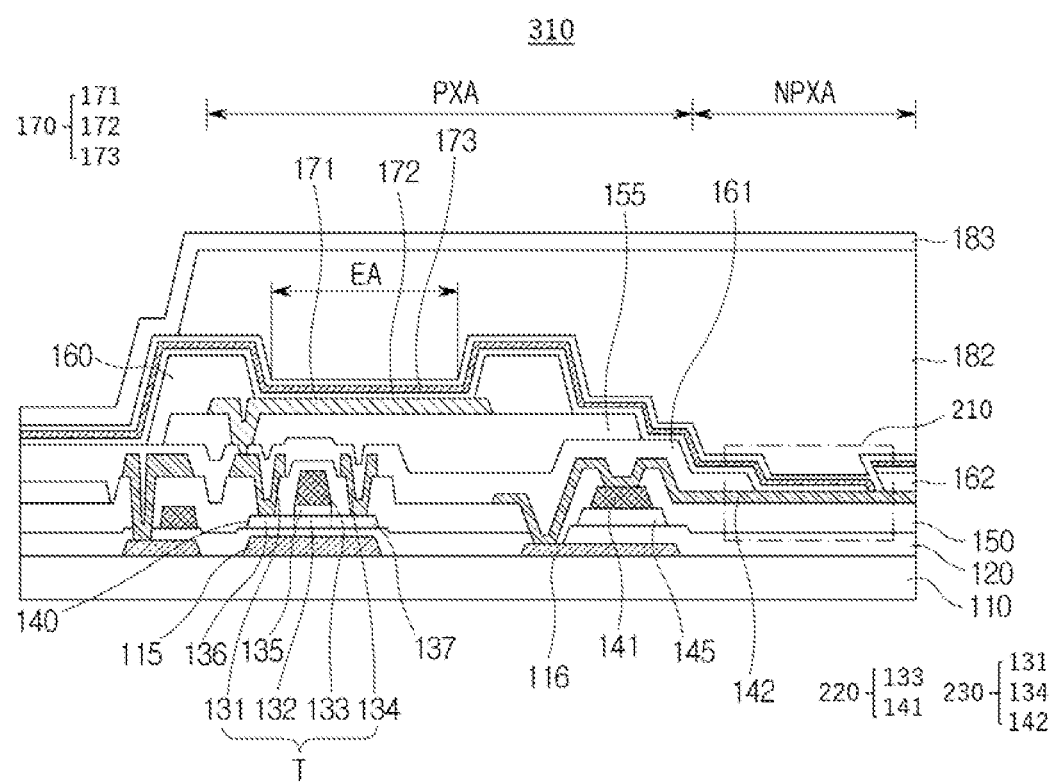
FIG. 4 is a cross-sectional view of a display panel according to several embodiments of the present disclosure.
Figure 5:
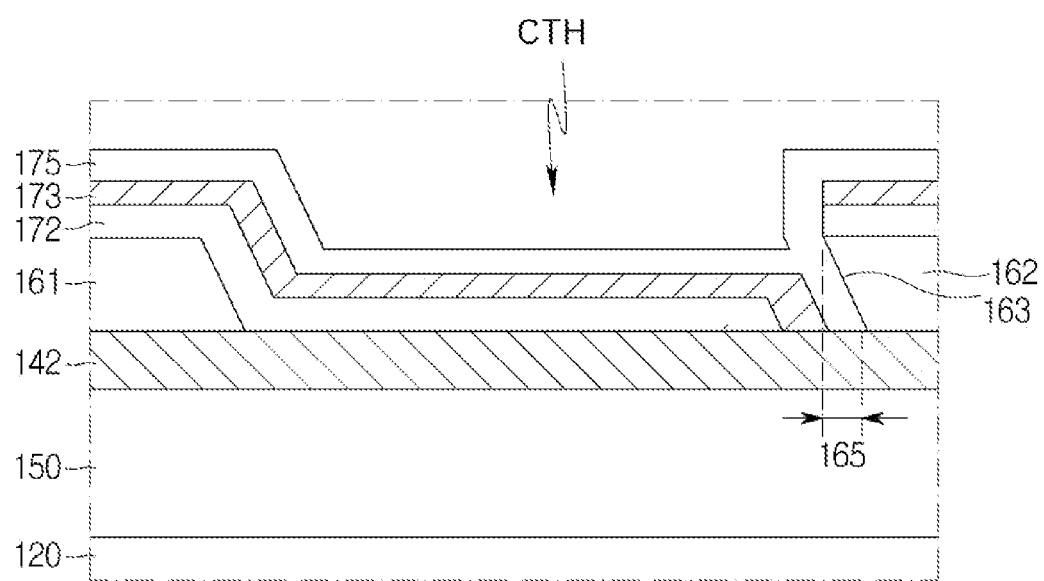
FIG. 5 is an enlarged view of a portion corresponding to a contact area of FIG. 4.

FIG. 4 is a cross-sectional view of a display panel 310 according to several embodiments of the present disclosure. FIG. 5 is an enlarged view of a portion corresponding to a contact area 210 of FIG. 4. The display panel 310 can be applied to any display device according to all embodiments of the present disclosure including the display device of FIG. 1.

Referring to FIG. 4, the display panel 310 can include a pixel area PXA, and a non-pixel area NPXA. In the pixel area PXA, circuit elements and a light-emitting element LD constituting a pixel PX are formed, and the non-pixel area NPXA is placed near the pixel area PXA. The non-pixel area NPXA can include a boundary between adjacent pixels PXs, and/or the non-display area NDA.

As shown in FIG. 4, according to several embodiments of the present disclosure, the display panel 310 can include a light-emitting element 170 of a top emission type. In the case where the light-emitting element LD is the top emission type, light from an organic emission layer is emitted through a cathode electrode formed at the top surface of the organic emission layer.

The display panel 310 can include a substrate 110, a buffer film 120, a transistor T, a first passivation film 161, a bank 160, the light-emitting element 170, the contact area 210, and the like.

The substrate 110 is a base member of the display panel 310, and can be a light-transmissive substrate. The substrate 110 can be a rigid substrate including glass or tempered glass, or can be a flexible substrate made of a plastic material. For example, the substrate 110 can be made of a plastic material, such as polyimide (PI), polyethylene terephthalate (PET), polyethylene naphthalate (PEN), polycarbonate (PC), and the like. However, the material of the substrate 110 is not limited thereto.

On the substrate 110, a light-shielding layer 115 and a power line 116 are placed. The light-shielding layer 115 is placed to be vertically overlapped by an active pattern 140 of the transistor T, and can thus protect the oxide semiconductor device from external light.

The power line 116 can be connected to, for example, a first power line PL1 through which the high-potential driving voltage ELVDD is applied or a second power line PL2 through which the low-potential driving voltage ELVSS is applied, but the present disclosure is not limited thereto.

The buffer film 120 is placed on the substrate 110 in such a manner as to cover the light-shielding layer 115 and the power line 116. The buffer film 120 can prevent diffusion of ions or impurities from the substrate 110 and can block moisture penetration. In addition, the buffer film 120 can enhance the flatness of the surface of the substrate 110.

The buffer film 120 can include an inorganic material, such as an oxide, a nitride, and the like, an organic material, or an organic-inorganic compound. The buffer film 120 can be formed in a single-layer or multi-layer structure. For example, the buffer film 120 can have a structure of three or more layers of silicon oxide, silicon nitride, and silicon oxide in that order.

The active pattern 140 can be formed on the buffer film 120. The active pattern 140 can be made of a silicon-based semiconductor material or an oxide-based semiconductor material. As the silicon-based semiconductor material, amorphous silicon or polycrystalline silicon can be used. As the oxide-based semiconductor material, a quaternary metal oxide, such as an indium tin gallium zinc oxide (InSnGaZnO); a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), or a tin aluminum zinc oxide (SnAlZnO); or a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), an indium oxide (InO), a tin oxide (SnO), or a zinc oxide (ZnO), can be used.

The active pattern 140 can include a drain region 136 and a source region 137 that contains p-type or n-type impurities. A channel CH can be formed between the drain region 136 and the source region 137.

Gate insulation films 135 and 145 can be placed correspondingly to areas in which a gate electrode 133 and a first connection electrode 141 are to be formed, respectively, which will be described later. For example, the gate insulation film 135 can be formed on the active pattern 140. In addition, the gate insulation film 145 can be formed on the buffer film 120 in such a manner as to be adjacent to the power line 116 or have at least an area that vertically overlaps the same. Each of the gate insulation films 135 and 145 can be a silicon oxide (SiOx), a silicon nitride (SiNx), or multiple films thereof.

On the gate insulation films 135 and 145, a first conductive film 220 can be placed. The first conductive film 220 can include the gate electrode 133. The gate electrode 133 can be placed corresponding to a position between the drain region 136 and the source region 137 of the active pattern 140.

The gate electrode 133 is made of any one or an alloy of two or more selected from a group consisting of molybdenum (Mo), aluminum (Al), chromium (Cr), gold (Au), titanium (Ti), nickel (Ni), neodymium (Nd), and copper (Cu). In addition, the gate electrode 133 can be multiple layers composed of any one or an alloy of two or more selected from a group consisting of molybdenum (Mo), aluminum (Al), chromium (Cr), gold (Au), titanium (Ti), nickel (Ni), neodymium (Nd), and copper (Cu). For example, the gate electrode 133 can be two layers of molybdenum and aluminum-neodymium, or molybdenum and aluminum.

The first conductive film 220 can further include the first connection electrode 141. The first connection electrode 141 can be placed in such a manner as to be adjacent to the second power line PL2 or have at least an area overlapping the same. The first connection electrode 141 can be composed of the same material as the gate electrode 133, and can be formed through the same process as the gate electrode 133. However, the present disclosure is not limited thereto.

The first conductive film 220 can further include electrodes of the circuit elements and driving lines, for example, a lower electrode of the storage capacitor Cst, the gate lines GL1 to GLn, and the like.

On the first conductive film 220, an interlayer insulation film 150 can be formed. The interlayer insulation film 150 covers the gate electrode 133 and the first connection electrode 141 constituting the first conductive film 220. The interlayer insulation film 150 can be a silicon oxide film (SiOx), a silicon nitride film (SiNx), or multiple layers thereof.

In various embodiments, the interlayer insulation film 150 can be configured in multiple layers, and conductive layers can be further formed between the multiple layers of the interlayer insulation film 150. The conductive layers formed between the interlayer insulation films 150 can further include electrodes of the circuit element, and driving lines, for example, an auxiliary gate electrode of the transistor T, an upper electrode of the storage capacitor Cst, and the like.

On the interlayer insulation film 150, a second conductive film 230 can be formed. The second conductive film 230 can be a source-drain layer.

The second conductive film 230 can include a source electrode 134 and a drain electrode 131. The source electrode 134 and the drain electrode 131 can be placed on the interlayer insulation film 150, being spaced apart from each other by a predetermined distance. The source electrode 134 and the drain electrode 131 can be connected to the source region 137 and the drain region 136 of the active pattern 140, respectively, through a contact area penetrating through the interlayer insulation film 150.

The source electrode 134 and the drain electrode 131 can be formed in a single layer or multiple layers composed of any one or an alloy of two or more selected from a group consisting of molybdenum (Mo), aluminum (Al), chromium (Cr), gold (Au), titanium (Ti), nickel (Ni), neodymium (Nd), and copper (Cu). In the case where the source electrode 134 and the drain electrode 131 are multiple layers, they can be composed of two layers of molybdenum and aluminum-neodymium, or three layers of titanium and aluminum and titanium; molybdenum and aluminum and molybdenum; or molybdenum and aluminum-neodymium and molybdenum.

The source electrode 134, the drain electrode 131, the gate electrode 133, and the active pattern 140 corresponding to those can constitute the transistor T. The transistor T can be, for example, the driving transistor DT or the switching transistor ST. FIG. 4 shows, as an example, the driving transistor DT of which the drain electrode 131 is connected to a first electrode 171 of the light-emitting element 170.

The second conductive film 230 can further include a second connection electrode 142. The second connection electrode 142 can be connected to the power line 116 through a contact area penetrating through the interlayer insulation film 150 and the buffer film 120. In several embodiments, the second connection electrode 142 can be connected to the first connection electrode 141.

The second connection electrode 142 can be composed of the same material as the source electrode 134 and the drain electrode 131, and can be formed in a single layer or multiple layers.

The second connection electrode 142 and the first passivation film 161, 162 can form the contact area 210 together. The contact area 210 can be defined by sidewalls of the first passivation film 161, 162 and an upper surface of the second connection electrode 142. In the contact area 210, the second connection electrode 142 and a second electrode 173 can be connected to each other.

A sidewall 163 of the first passivation film 162 that forms a side of the contact area 210 can have a reverse-tapered shape. On the upper surface of the second connection electrode 142, a shadow area 165 can be defined being vertically overlapped by the sidewall 163 having the reverse-tapered shape.

In the light-emitting element 170, an emission layer 172 interposed between the first electrode 171 and the second electrode 173 can have a multi-layer thin-film structure including a light generation layer. At least a portion of the multi-layer thin-film structure can be formed through a deposition process. Specifically, an electron transport layer (ETL) and/or an electron injection layer (EIL) can be formed through a deposition process.

In the process of depositing the emission layer 172 within the contact area 210 as shown, because the sidewall 163 covers the shadow area, the emission layer 172 is not deposited in the shadow area 165, and the shadow area 165 can thus be exposed. Afterward, the second electrode 173 is deposited on the emission layer 172, and the second electrode 173 can be in direct contact with the upper surface of the second connection electrode 142 including the shadow area 165.

If one sidewall 162 of the contact area 210 has a tapered shape as the opposite side has, the emission layer 172 is deposited uniformly on a lower surface of the contact area 210, and thus the second electrode 173 is not in direct contact with the second connection electrode 142. This increases the contact resistance of the structure of the contact area 210 and thus causes deteriorations in power consumption and heat of the organic light-emitting diode display device.

In the organic light-emitting diode display device according to an embodiment of the present disclosure, by using the above-described shape of the reverse-tapered sidewall 162, the second connection electrode 142 and the second electrode 173 are in direct contact with each other. Accordingly, the contact resistance of the structure of the contact area 210 can be reduced, and the power consumption and the heat of the organic light-emitting diode display device can be reduced.

In various embodiments, the second conductive film 230 can further include various driving lines, for example, the data lines DL1 to DLm, and the power lines (for example, the first power line PL1).

On the second conductive film 230, the first passivation film 161 can be formed. The first passivation film 161 can be an insulation film for protecting the lower elements, and can be a silicon oxide film (SiOx), a silicon nitride film (SiNx), or multiple layers thereof.

On the first passivation film 161, an overcoat film 155 can be formed. The overcoat film 155 can be a planarizing film for reducing the difference in level of the lower structure, and can be composed of an organic material such as polyimide, benzocyclobutene series resin, acrylate, and the like.

The light-emitting element 170 is formed on the overcoat film 155 and includes the first electrode 171, the emission layer 172, and the second electrode 173. The first electrode 171 can be an anode electrode, and the second electrode 173 can be a cathode electrode. As shown in FIG. 4, in the case where the light-emitting element 170 is a top emission type, the first electrode 171 can be a reflective electrode and the second electrode 173 can be a transmissive electrode.

The first electrode 171 is formed on the overcoat film 155. The first electrode 171 is connected to the drain electrode 131 of the transistor T through a via hole penetrating through the overcoat film 155 and the first passivation film 161. The first electrode 171 can be composed of a transparent conductive material, such as indium tin oxide (ITO), indium zinc oxide (IZO), zinc oxide (ZnO), or the like. In the case where the first electrode 171 is a reflective electrode, the first electrode 171 can include a reflective layer. The reflective layer can be made of aluminum (Al), copper (Cu), silver (Ag), nickel (Ni), or an alloy thereof. In an embodiment, the reflective layer can be composed of an alloy (APC) of silver, palladium, and copper.

The bank 160 can be formed on the overcoat film 155. The bank 160 can be a pixel definition film defining an emission area EA of the pixel PX. The bank 160 can be formed such that a partial area, for example, a central portion of the first electrode 171 is exposed, but the remaining area, for example, the edge of the first electrode 171, is covered. It is preferable that the exposed area of the first electrode 171 is designed to have as much area as possible in order to ensure a sufficient aperture ratio. The exposed area of the first electrode 171 that is not covered by the bank 160 can be defined as the emission area EA of the pixel PX. In the emission area EA, the first electrode 171, the emission layer 172, and the second electrode 173 are stacked in such a manner as to be in direct contact with each other. The bank 160 can be made of an organic film such as an acrylic resin, an epoxy resin, a phenolic resin, a polyamide resin, a polyimide resin, and the like.

On the first electrode 171 and the bank 160, the emission layer 172 is formed. The emission layer 172 can extend to the non-pixel area NPXA, can fill the lower surface of the contact area 210, and can partially expose the upper surface of the second connection electrode 142.

As described above, the emission layer 172 can have a multi-layer thin-film structure including the light generation layer. In several embodiments of the present disclosure, at least a portion of the emission layer 172 can be formed on the bank 160 and the overcoat film 155 by an inkjet method. Specifically, a hole injection layer (HIL) and a hole transport layer (HTL) of the emission layer 172, and the organic emission layer can be formed by an inkjet method, but the present disclosure is not limited thereto.

For example, the hole transport layer smoothly transports holes injected from the first electrode 171, to the organic emission layer. The organic emission layer can be made of an organic material including a phosphorescent or fluorescent material. The electron transport layer smoothly transports electrons injected from the second electrode 173, to the organic emission layer.

The emission layer 172 can be formed in a tandem structure of two or more stacks. In this case, each of the stacks can include the hole transport layer, the organic emission layer, and the electron transport layer. In the case where the emission layer 172 is formed in the tandem structure of two or more stacks, a charge generation layer is formed between the stacks. The charge generation layer can include an n-type charge generation layer and a p-type charge generation layer. The n-type charge generation layer is positioned near the lower stack. The p-type charge generation layer is formed on the n-type charge generation layer and is thus positioned near the upper stack. The n-type charge generation layer injects electrons into the lower stack, and the p-type charge generation layer injects holes into the upper stack. The n-type charge generation layer can be an organic layer obtained by doping, into an organic host material having electron transport capability, alkali metals, such as lithium (Li), sodium (Na), potassium (K), or cesium (Cs), or alkaline earth metals, such as magnesium (Mg), strontium (Sr), barium (Ba), or radium (Ra). The p-type charge generation layer can be an organic layer obtained by doping dopants into an organic host material having hole transport capability.

The color of light generated by the light-emitting element 170 can be one among red, green, and blue, but the present disclosure is not limited thereto. For example, the color of light generated by the light generation layer of the emission layer 172 can be one among magenta, cyan, and yellow colors, or can be white.

The second electrode 173 is formed on the emission layer 172. The second electrode 173 can be formed in such a manner as to cover the emission layer 172. The second electrode 173 can be in direct contact with the second connection electrode 142 exposed in the contact area 210.

The second electrode 173 can be made of a transparent conductive material (TCO) capable of transmitting light, or a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof. In the case where the second electrode 173 is made of the semi-transmissive conductive material, light emission efficiency can be increased due to a micro cavity.

A second passivation film 175 is formed on the second electrode 173. The second passivation film 175 prevents oxygen or moisture from penetrating into the light-emitting element 170.

The second passivation film 175 can be made of, for example, at least one of inorganic materials, such as a silicon nitride, an aluminum nitride, a zirconium nitride, a titanium nitride, a hafnium nitride, a tantalum nitride, a silicon oxide, an aluminum oxide, and a titanium oxide.

The second passivation film 175 can be formed to be wide within a display area AA of the substrate 110. The second passivation film 175 can be formed in such a manner as to cover the second electrode 173 and the sidewall 163 that are formed inside the contact area 210. The second passivation film 175 can be formed in such a manner as to cover at least a portion of the shadow area 165.

A cover layer 182 serves as a foreign-matter cover layer (also referred to as a particle cover layer). The cover layer 182 can be formed to have a sufficient thickness so as to prevent foreign matter (particles) from penetrating into the emission layer 172 and the second electrode 173. The cover layer 182 can be made of a transparent material in order to transmit light emitted from the emission layer 172. The cover layer 182 can be made of an organic material capable of transmitting 99% or more of light emitted from the emission layer 172, for example, an acryl resin, an epoxy resin, a phenolic resin, a polyamide resin, a benzocyclobutene resin, or a polyimide resin, but no limitation thereto is imposed.

A third passivation film 183 is an inorganic film, and can be made of the same material as the second passivation film 175. For example, the third passivation film 183 can be made of at least one of inorganic materials, such as a silicon nitride, an aluminum nitride, a zirconium nitride, a titanium nitride, a hafnium nitride, a tantalum nitride, a silicon oxide, an aluminum oxide, and a titanium oxide.

Figure 6:
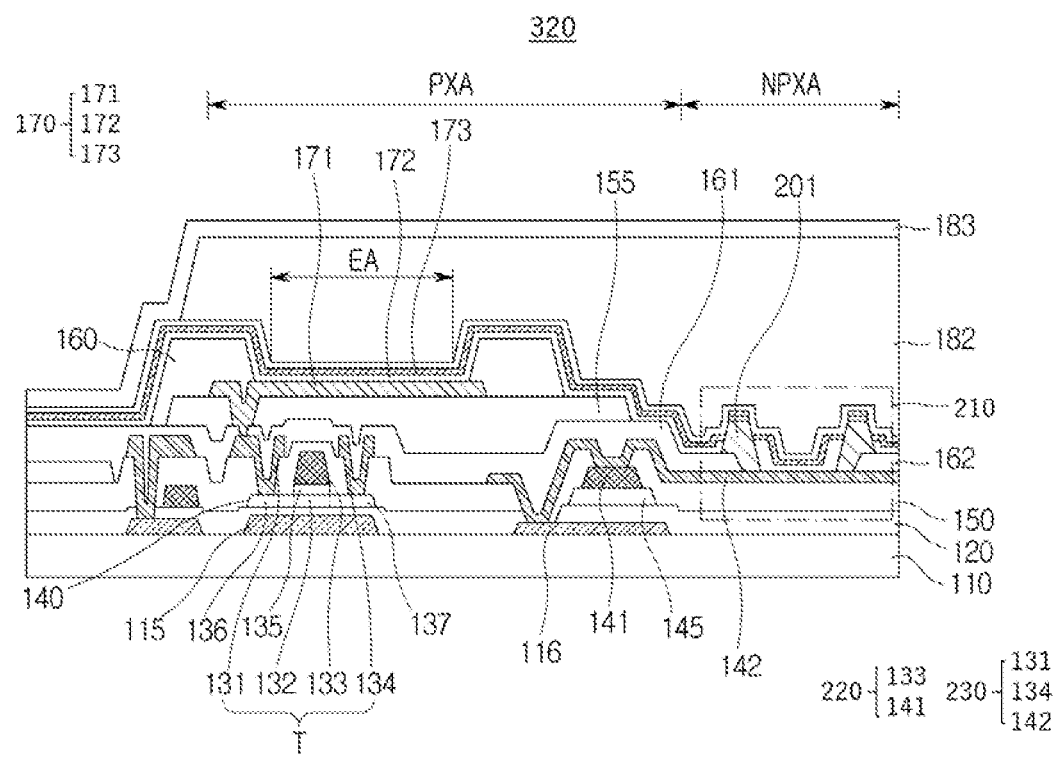
FIG. 6 is a cross-sectional view of a display panel according to other embodiments of the present disclosure.
Figure 7:
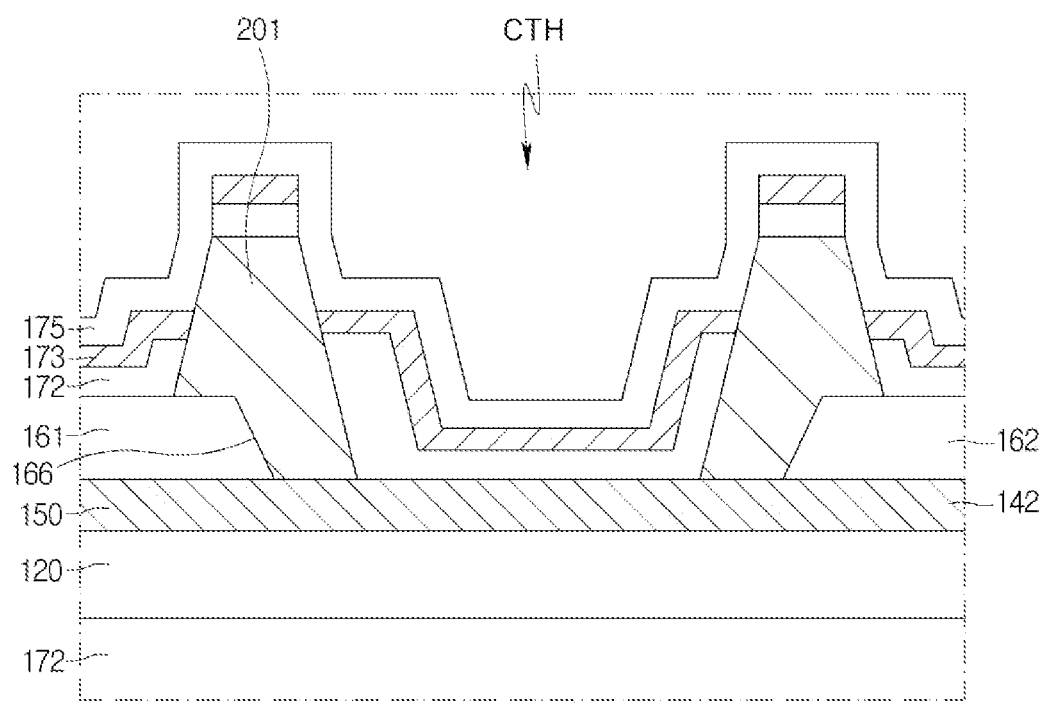
FIG. 7 is an enlarged view of a portion corresponding to a contact area of FIG. 6.

FIG. 6 is a cross-sectional view of a display panel 320 according to other embodiments of the present disclosure. FIG. 7 is an enlarged view of a portion corresponding to a contact area 210 of FIG. 6. The display panel 320 can be applied to any display device according to all embodiments of the present disclosure including the display device of FIG. 1.

Referring to FIGS. 6 and 7, it is seen that a portion corresponding to the contact area 210 is configured differently from that of the embodiment described above. Hereinafter, a description of common parts will be omitted and differences will be mainly described.

A filler 201 can be formed in such a manner as to cover at least a portion of an upper surface of a second connection electrode 142 and a sidewall 166 in the contact area 210. For example, the filler 201 can be made by applying, with an inkjet method, liquid drops that contain metallic particles such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), and the like. Therefore, the filler 201 can have conductivity.

After the filler 201 is formed in such a manner as to cover at least a portion of the upper surface of the second connection electrode 142 and the sidewall 166 in the contact area 210, a light-emitting element 170 can be formed. Accordingly, due to the presence of the filler 201, an emission layer 172 can have a portion on the first passivation film 161 and a portion inside the contact area 210 disconnected from each other.

In the meantime, a second electrode 173 formed on the emission layer 172 can be in direct contact with the filler 201. The second electrode 173 can be formed by depositing a conductive material on the emission layer 172.

As described above, due to the conductivity of the filler 201, a conductive path can be formed between the second electrode 173 and the second connection electrode 142. Therefore, the connection resistance of the contact area 210 can be lowered.

Figure 8:
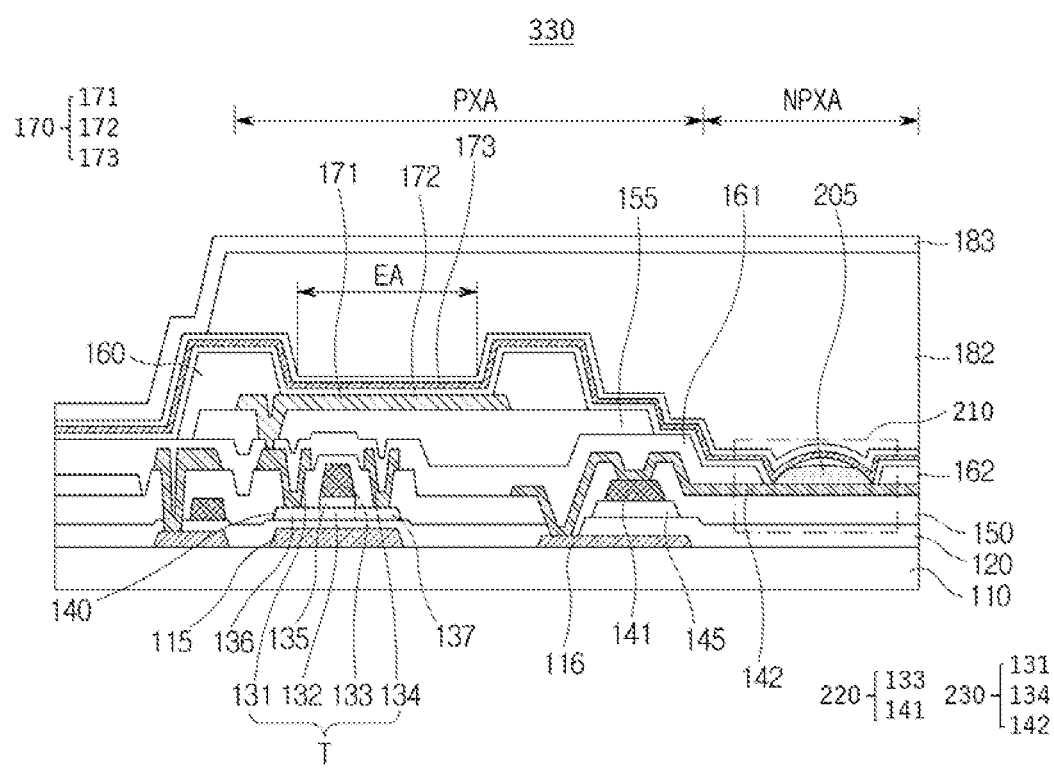
FIG. 8 is a cross-sectional view of a display panel according to other embodiments of the present disclosure.
Figure 9:
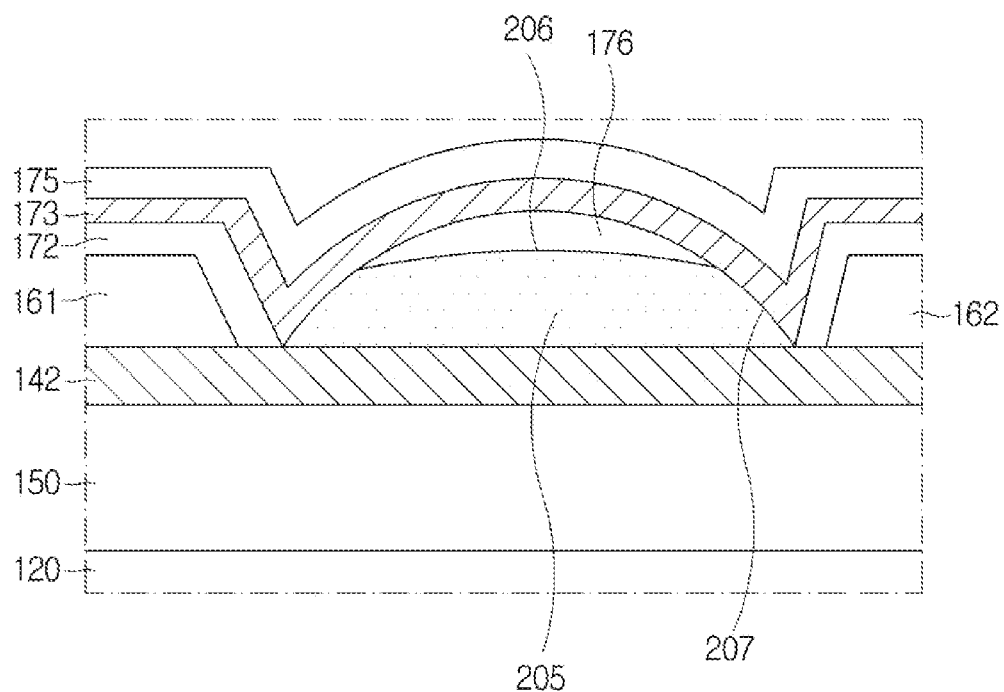
FIG. 9 is an enlarged view of a portion corresponding to a contact area of FIG. 8.

FIG. 8 is a cross-sectional view of a display panel 330 according to other embodiments of the present disclosure. FIG. 9 is an enlarged view of a portion corresponding to a contact area 210 of FIG. 8. The display panel 330 can be applied to any display device according to all embodiments of the present disclosure including the display device of FIG. 1.

Referring to FIGS. 8 and 9, it is seen that a portion corresponding to the contact area 210 is configured differently from that of the embodiment described above. Hereinafter, a description of common parts will be omitted and differences will be mainly described.

A filler 205 can be formed at a lower surface of the contact area 210, that is, on an upper surface of a second connection electrode 142. The filler 205 can cover at least a portion of the upper surface of the second connection electrode 142.

For example, the filler 205 can be made by applying, with an inkjet method, liquid drops that contain metallic particles such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), and the like. Therefore, the filler 205 can have conductivity.

The filler 205 formed on the second connection electrode 142 can have a rounded surface 206 due to surface energy, and the like. Therefore, an emission layer 176, a second electrode 173, and a second passivation film 175 formed being stacked on the filler 205 can also have rounded shapes.

After the filler 205 is formed in such a manner as to cover at least a portion of the upper surface of the second connection electrode 142, a light-emitting element 170 can be formed. The emission layer 172 can cover a portion of the upper surface 206 of the filler 205 and can expose a portion thereof. This is because when the emission layer 172 is formed through deposition, the emission layer 172 is not formed uniformly on the filler 205 due to poor step coverage of the material of the emission layer 172. Accordingly, due to the presence of the filler 205, the emission layer 172 can have a portion on the first passivation film 161 and a portion 176 on the filler 205 disconnected from each other.

On the emission layer 172, a second electrode 173 can be formed. The second electrode 173 can be formed by depositing a conductive material on the emission layer 172. The second electrode 173 can cover the surface of the emission layer 172 and can cover an upper surface 207 of the filler exposed by the emission layer 172. The upper surface 207 of the filler and the second electrode 173 can be in direct contact with each other. Via the filler 205, a conductive path can be formed between the second electrode 173 and the second connection electrode 142. Therefore, the connection resistance of the contact area 210 can be lowered.

Figure 10:
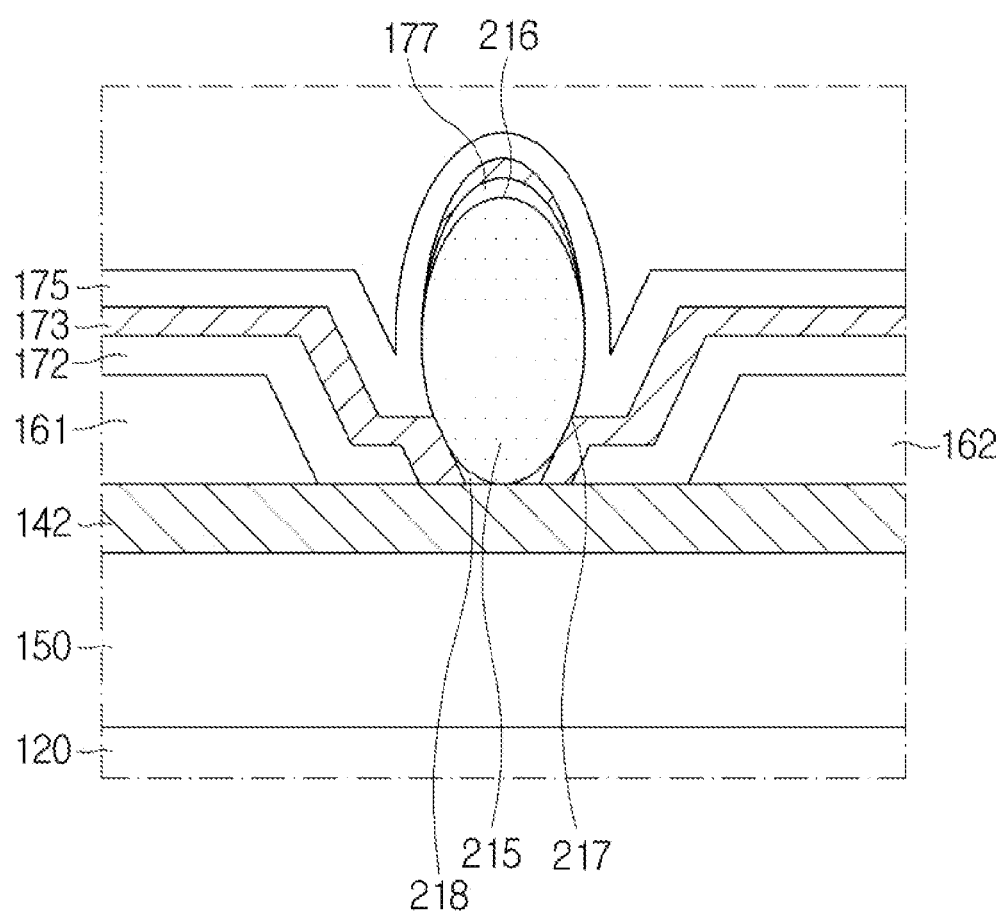
FIG. 10 is an enlarged view of a contact area from a cross-sectional view of a display panel according to other embodiments of the present disclosure.

FIG. 10 is an enlarged view of a contact area 210 from a cross-sectional view of a display panel according to other embodiments of the present disclosure. Hereinafter, a description of common parts will be omitted and differences will be mainly described.

Referring to FIG. 10, a filler 215 can be formed protruding towards an upper surface of the contact area 210. In several embodiments, an upper surface 216 of the filler can be formed higher than an upper surface of a second passivation film 175. In order to form the filler 215 in the shape shown in FIG. 10, a conductive material having a high viscosity can be applied on the second connection electrode 142 by using an inkjet method.

Due to the shape of the overall rounded filler 215, a lower surface 217 of the filler can form a shadow area on the upper surface of the second connection electrode 142. Herein, the lower surface 217 of the filler refers to a surface of a portion where the width of the filler 215 decreases as it goes down.

This is similar to that in the above-described embodiments of FIGS. 4 and 5, the shadow area 165 is formed on the upper surface of the second connection electrode 142 due to the shape of the sidewall 163 of the reverse-tapered contact hole.

Therefore, the emission layer 172 may not be formed on an area of the upper surface of the second connection electrode 142 that is vertically overlapped by the lower surface 217 of the filler, that is, on the shadow area. Accordingly, due to the filler 215, the emission layer 172 can have a portion on the first passivation film 161 and a portion 177 on the filler 205 disconnected from each other.

The second electrode 173 can be formed in such a manner as to cover the emission layer 172. The second electrode 173 can cover the upper surface of the second connection electrode 142 exposed by the emission layer 172. Through this, the second electrode 173 and the emission layer 172 can be in direct contact with each other. A conductive path can be formed on a contact surface between the second electrode 173 and the emission layer 172, and the resistance of the contact area 210 can be lowered.

In addition, the second electrode 173 can be formed in an extending manner to be in contact with the lower surface 217 of the filler. If the filler 216 contains a conductive material, a conductive path can be formed between the second electrode 173 and the lower surface 217 of the filler and the resistance of the contact area 210 can be lowered.

In several embodiments, the second electrode 173 may not completely fill the space between the lower surface 217 of the filler and the upper surface of the second connection electrode 142, and a void 218 can remain.

In summary, due the shape of the filler 215, the second connection electrode 142 and the second electrode 173 can be in direct contact with each other. Alternatively, the second electrode 173 and the lower surface 217 of the filler are in contact with each other, and through the contact surface, the conductive path can be formed between the second electrode 173 and the second connection electrode 142.

Figure 11:
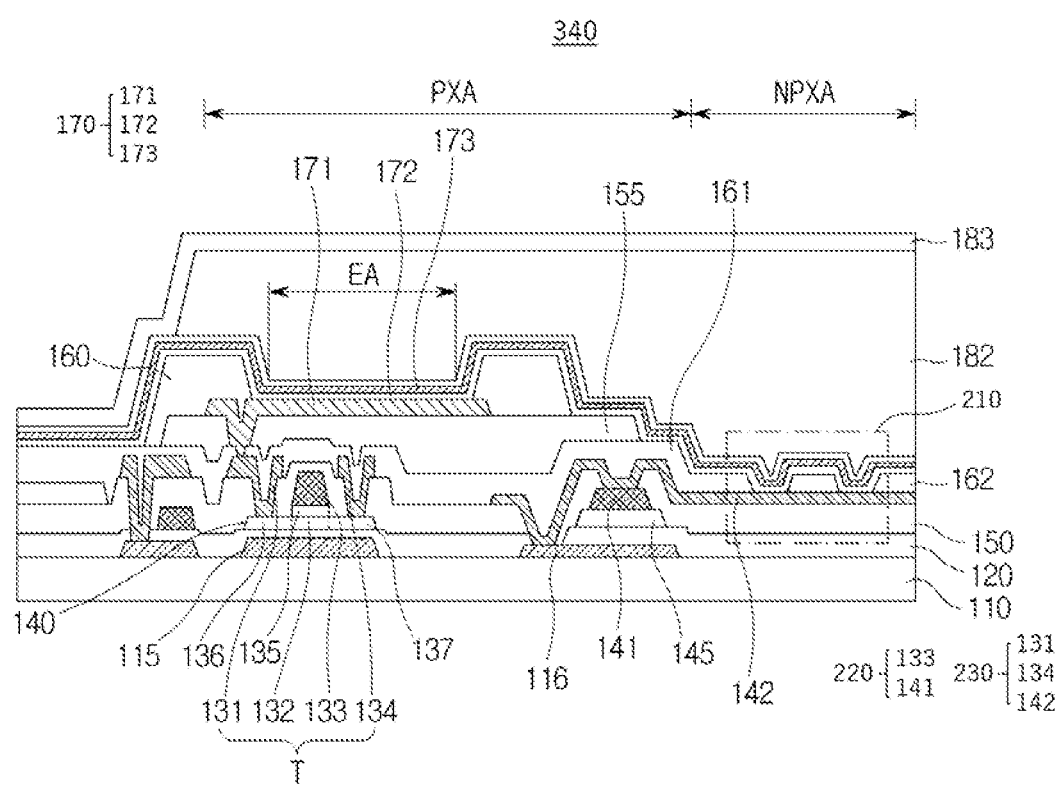
FIG. 11 is a cross-sectional view of a display panel according to other embodiments of the present disclosure.
Figure 12:
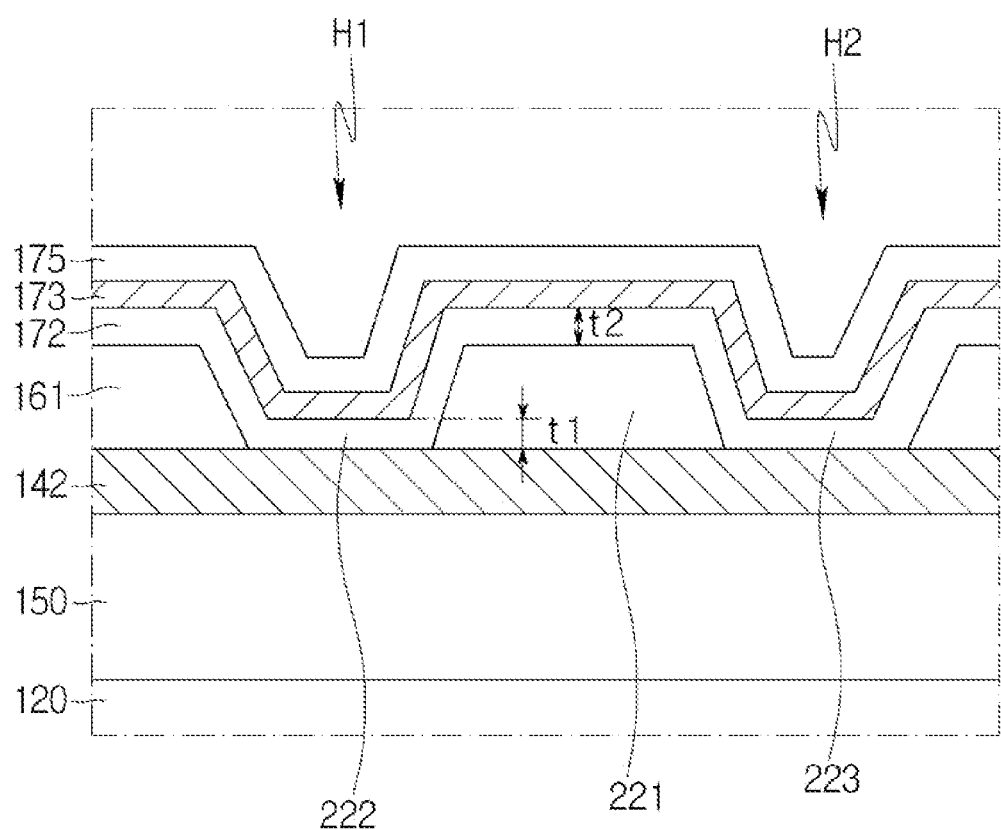
FIG. 12 is an enlarged view of a portion corresponding to a contact area of FIG. 11.

FIG. 11 is a cross-sectional view of a display panel 340 according to other embodiments of the present disclosure. FIG. 12 is an enlarged view of a portion corresponding to a contact area 210 of FIG. 11. The display panel 340 can be applied to any display device according to all embodiments of the present disclosure including the display device of FIG. 1.

Referring to FIGS. 11 and 12, it is seen that a portion corresponding to the contact area 210 is configured differently from that of the embodiment described above. Hereinafter, a description of common parts will be omitted and differences will be mainly described.

The contact area 210 can include a first hole H1 and a second hole H2. Specifically, a filler 221 is formed in such a manner as to cover a central portion of a second connection electrode 142 exposed within the contact area 210. The filler 221 serves as a type of bank and can divide the contact area 210 into the first hole H1 and the second hole H2.

The filler 221 can include the same material as the first passivation film 161. After the first passivation film is formed to cover the second connection electrode 142, the first hole H1 and the second hole H2 are formed penetrating through the first passivation film, thereby forming the filler 221.

A thickness t1 of an emission layer 222, 223 on the second connection electrode 142 can be different from a thickness t2 of the emission layer on an upper surface of the filler 221. Specifically, the thickness t1 of the emission layer 222, 223 on the second connection electrode 142 can be smaller than the thickness t2 of the emission layer on the upper surface of the filler 221.

As described above, due to the filler 221 that serves as a type of bank, when an emission layer 172 and a second electrode 173 are formed through deposition, the thickness of the emission layer 172 and the thickness of the second electrode 173 inside the first hole H1 and the second hole H2 are smaller than the thickness of the emission layer 172 and the thickness of second electrode 173 outside the first hole H1 and the second hole H2. That is, the filler 221 functions as a shielding film.

In the first hole H1 and the second hole H2, the second electrode 173 forms a contact area via the emission layer 172. Herein, the emission layer 172 is formed to be thinner than a usual thickness, so that the resistance of the emission layer 222, 223 between the second electrode 173 and the second connection electrode 142 can be lowered. Therefore, the resistance of the contact area 210 can be lowered.

Figure 13:
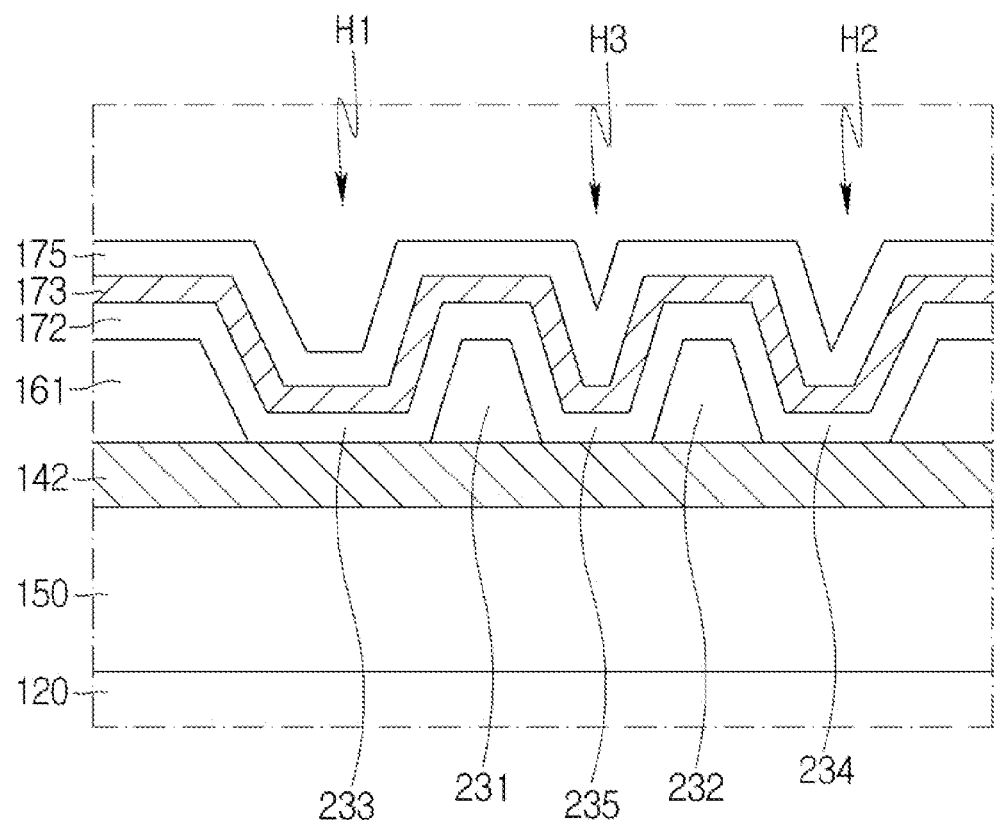
FIG. 13 is an enlarged view of a contact area from a cross-sectional view of a display panel according to other embodiments of the present disclosure.

FIG. 13 is an enlarged view of a contact area 210 from a cross-sectional view of a display panel according to other embodiments of the present disclosure.

Referring to FIG. 13, two or more fillers 231 and 232 can be formed inside the contact area 210. The contact area 210 can be divided into first to third hole H1 to H3 by the fillers 231 and 232.

Since the contact area 210 is divided into the first to the third hole H1 to H3, the area of lower surfaces of the first to the third hole H1 to H3 can be smaller than the area of the first and the second hole H1 and H2 in the above-described embodiment shown in FIG. 12.

Accordingly, when the emission layer 172 is formed, the emission layer 233, 234, 235 formed at the lower surfaces of the first to the third hole H1 to H3 has a thickness smaller than a usual thickness of the emission layer 172. The emission layer 172 is formed to be thinner than the usual thickness, so that the resistance of the emission layer 233, 234, 235 between the second electrode 173 and the second connection electrode 142 can be lowered. Therefore, the resistance of the contact area 210 can be lowered.

Figure 14:
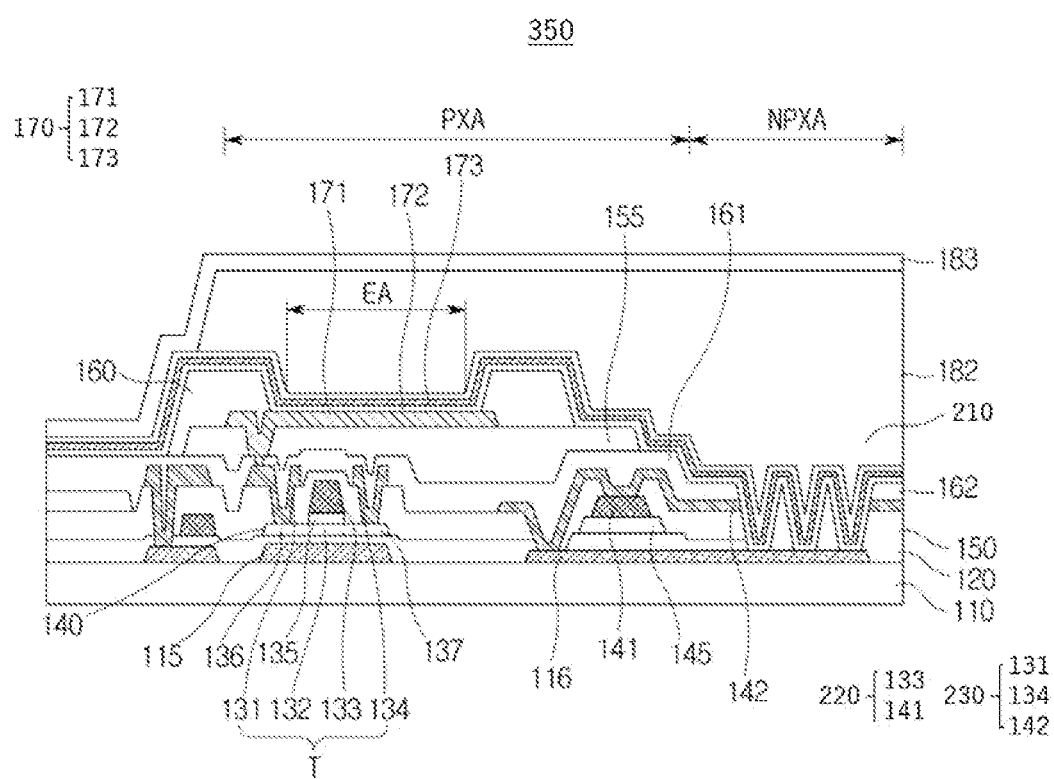
FIG. 14 is a cross-sectional view of a display panel according to other embodiments of the present disclosure.

FIG. 14 is a cross-sectional view of a display panel 350 according to other embodiments of the present disclosure. The display panel 350 can be applied to any display device according to all embodiments of the present disclosure including the display device of FIG. 1.

Referring to FIG. 14, differently from the above-described embodiments, a lower surface of a contact area 210 can be defined by an upper surface of the power line 116. That is, when the contact area 210 is formed penetrating through the first passivation film 162, the interlayer insulation film 150, and the buffer film 120, the upper surface of the power line 116 is exposed, thereby forming the contact area 210. It is obvious that the configuration of FIGS. 4 to 13 for reducing resistance between the second electrode 172 and the power line 116 can be applied, within the contact area 210 defined by the upper surface of the power line 116 connected to the high-level power supply voltage ELVDD or the low-level power supply voltage ELVSS.

It will be understood by those skilled in the art that the present disclosure can be embodied in other specific forms without changing the technical idea or essential characteristics of the present disclosure. Therefore, it should be understood that the embodiments described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. An organic light-emitting diode display device comprising:
    a substrate in which an emission area and a non-emission area are defined;
    a power line provided on the substrate;
    at least one insulation film covering the power line;
    a light-emitting element provided above the at least one insulation film;
    a connection electrode connected to the power line, and extending onto the at least one insulation film; and
    a passivation film including a contact area where a portion of the connection electrode is exposed in the non-emission area,
    wherein the light-emitting element includes a first electrode, an emission layer, and a second electrode that are stacked in order, and
    the second electrode is in direct contact with the connection electrode in the contact area, and
    wherein the contact area of the passivation film includes one sidewall defined by the passivation film, and the one sidewall has a reverse-tapered shape.

2. The organic light-emitting diode display device of claim 1, wherein an upper surface of the connection electrode includes a shadow area that is vertically overlapped by the one sidewall, and
    the second electrode is in direct contact with the shadow area.

3. The organic light-emitting diode display device of claim 2, wherein the emission layer is not provided on the shadow area.

4. The organic light-emitting diode display device of claim 1, wherein the contact area includes a filler provided at a central portion of an upper surface of the connection electrode exposed by the passivation film, and
    a rounded lower surface portion of the filler forms a shadow area on the connection electrode.

5. The organic light-emitting diode display device of claim 4, wherein the second electrode is in direct contact with the shadow area.

6. The organic light-emitting diode display device of claim 4, wherein the second electrode is in contact with the lower surface portion of the filler.

7. The organic light-emitting diode display device of claim 1, wherein an area of contact between the emission layer and the connection electrode in the contact area is greater than an area of contact between the second electrode and the connection electrode in the contact area.

8. The organic light-emitting diode display device of claim 1, wherein the emission layer and the connection electrode contact each other at a layer between the light-emitting element and the power line.

9. The organic light-emitting diode display device of claim 1, wherein the second electrode and the emission layer are both in direct contact with the connection electrode in the contact area.

10. An organic light-emitting diode display device comprising:
    a substrate in which an emission area and a non-emission area are defined;
    a power line provided on the substrate;
    at least one insulation film covering the power line;
    a light-emitting element provided above the at least one insulation film;
    a connection electrode connected to the power line, and extending onto the at least one insulation film;
    a passivation film including a contact area where a portion of the connection electrode is exposed in the non-emission area; and
    a conductive filler covering at least a portion of an upper surface of the connection electrode exposed by the passivation film,
    wherein the light-emitting element includes a first electrode, an emission layer, and a second electrode that are stacked in order, and
    the second electrode is in direct contact with the conductive filler.

11. The organic light-emitting diode display device of claim 10, wherein a conductive path between the second electrode and the connection electrode is provided through the conductive filler.

12. The organic light-emitting diode display device of claim 11, wherein the conductive filler covers at least a portion of opposite sidewalls of the contact area.

13. The organic light-emitting diode display device of claim 10, wherein a rounded lower surface portion of the conductive filler forms a shadow area on the connection electrode.

14. The organic light-emitting diode display device of claim 13, wherein the second electrode is in contact with the lower surface portion of the conductive filler.

15. The organic light-emitting diode display device of claim 10, wherein the conductive filler has a convex shape or a rounded shape.

16. The organic light-emitting diode display device of claim 10, wherein a portion of the emission layer is disposed on the conductive filler in the contact area.

17. The organic light-emitting diode display device of claim 10, wherein a portion of the second electrode has a rounded shape or a convex shape in the contact area.

18. An organic light-emitting diode display device comprising:
- a substrate in which an emission area and a non-emission area are defined;
- a power line provided on the substrate;
- at least one insulation film covering the power line;
- a light-emitting element provided above the at least one insulation film;
- a connection electrode connected to the power line, and extending onto the at least one insulation film;
- a passivation film including a contact area where a portion of the connection electrode is exposed in the non-emission area; and
- at least one filler covering an upper surface of the connection electrode exposed by the passivation film,
- wherein the light-emitting element includes a first electrode, an emission layer, and a second electrode that are stacked in order, and
- the emission layer extends to cover the connection electrode and the filler, and has a first portion on the connection electrode and a second portion on the filler that are different in thickness.

19. The organic light-emitting diode display device of claim 18, wherein the thickness of the first portion is smaller than the thickness of the second portion.

20. The organic light-emitting diode display device of claim 18, wherein penetrating through the at least one insulation film, the contact area exposes the power line.

* * * * *